US012624454B2

(12) United States Patent
Madananth et al.

(10) Patent No.: US 12,624,454 B2
(45) Date of Patent: May 12, 2026

(54) IN SITU FAILURE DETECTION IN SEMICONDUCTOR PROCESSING CHAMBERS

(71) Applicant: Applied Materials, Inc., Santa Clara, CA (US)

(72) Inventors: Srivatsa Madananth, Karnataka (IN); Dhananjai Kumar, Karnataka (IN); Yogananda Sarode Vishwanath, Bangalore (IN); Jacob Andrews, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 1354 days.

(21) Appl. No.: 16/705,963

(22) Filed: Dec. 6, 2019

(65) Prior Publication Data

US 2021/0175103 A1    Jun. 10, 2021

(51) Int. Cl.
| | |
|---|---|
| *C23C 16/458* | (2006.01) |
| *G01H 1/00* | (2006.01) |
| *H01J 37/32* | (2006.01) |
| *H10P 72/00* | (2026.01) |
| *H10P 72/76* | (2026.01) |
| *H10P 72/72* | (2026.01) |

(52) U.S. Cl.
CPC ........... *C23C 16/4586* (2013.01); *G01H 1/00* (2013.01); *H01J 37/32715* (2013.01); *H01J 37/32724* (2013.01); *H01J 37/32825* (2013.01); *H10P 72/0421* (2026.01); *H10P 72/0432* (2026.01); *H10P 72/0602* (2026.01);

*H10P 72/0604* (2026.01); *H10P 72/7624* (2026.01); *H01J 2237/002* (2013.01); *H01J 2237/24585* (2013.01); *H01J 2237/3341* (2013.01); *H10P 72/72* (2026.01)

(58) Field of Classification Search
CPC ...................... C23C 16/4586; H01L 21/68785
See application file for complete search history.

(56) References Cited

U.S. PATENT DOCUMENTS

| | | | | | |
|---|---|---|---|---|---|
| 5,446,334 A | * | 8/1995 | Gaffney | .............. | H01L 41/1132 |
| | | | | | 250/338.3 |
| 5,948,986 A | * | 9/1999 | Brown | .............. | H01L 21/67288 |
| | | | | | 361/234 |
| 6,114,662 A | * | 9/2000 | Guidotti | ........... | H01L 21/67109 |
| | | | | | 392/416 |
| 2004/0065259 A1 | * | 4/2004 | Inazumachi | ...... | H01L 21/67109 |
| | | | | | 118/724 |
| 2004/0107909 A1 | * | 6/2004 | Collins | ............. | H01J 37/32412 |
| 2005/0205110 A1 | * | 9/2005 | Kao | ...................... | C23C 14/022 |
| | | | | | 134/1.1 |
| 2008/0173237 A1 | * | 7/2008 | Collins | ............. | H01J 37/32477 |
| | | | | | 118/723 R |

(Continued)

*Primary Examiner* — Keath T Chen
(74) *Attorney, Agent, or Firm* — Kilpatrick Townsend & Stockton LLP

(57) ABSTRACT

Exemplary semiconductor processing chambers may include a chamber body defining a substrate processing region. The chambers may include a substrate support positioned within the substrate processing region. The substrate support may include a ceramic or polymeric insulator plate positioned between a cathode assembly and an electrostatic chuck assembly. The chambers may include an acoustic emission probe in contact with the insulator plate of the substrate support.

20 Claims, 4 Drawing Sheets

(56)          References Cited

U.S. PATENT DOCUMENTS

| 2010/0039747 | A1* | 2/2010 | Sansoni | ............ | H01L 21/67103 |
| | | | | | 361/234 |
| 2014/0154819 | A1* | 6/2014 | Gaff | ........................ | H01L 22/14 |
| | | | | | 156/345.52 |
| 2016/0379806 | A1* | 12/2016 | Xu | ........................ | C23C 16/403 |
| | | | | | 156/345.43 |
| 2017/0213753 | A1* | 7/2017 | Rogers | .............. | H01J 37/32697 |
| 2017/0213758 | A1* | 7/2017 | Rice | .................... | H01L 21/6831 |
| 2020/0195172 | A1* | 6/2020 | McMillan | ........... | H01L 21/6875 |
| 2020/0335368 | A1* | 10/2020 | Pan | ................... | H01L 21/67259 |

* cited by examiner

IN SITU FAILURE DETECTION IN SEMICONDUCTOR PROCESSING CHAMBERS

TECHNICAL FIELD

The present technology relates to semiconductor systems, processes, and equipment. More specifically, the present technology relates to processes and systems to protect substrate support assemblies.

BACKGROUND

Many substrate processing systems include substrate supports, such as an electrostatic chuck in combination with a base, to retain a wafer during semiconductor substrate processing. The substrate support may include a number of layers of materials or plates coupled together. The plates may perform separate functions, such as operating as an electrode, operating as a heater, operating to cool, among other aspects of semiconductor processing. Based on heating, cooling, and processing environment exposure, a number of stresses may be imparted on layers of the substrate support as well as on the semiconductor substrate. Thermal or other stresses imparted on some components of the substrate support or substrate may cause deformation, which may lead to cracking or other damage to the component of the support as well as the semiconductor substrate.

Thus, there is a need for improved systems and methods that can be used to improve lifetime and performance of processing chambers and components. These and other needs are addressed by the present technology.

SUMMARY

Exemplary semiconductor processing chambers may include a chamber body defining a substrate processing region. The chambers may include a substrate support positioned within the substrate processing region. The substrate support may include a ceramic or polymeric insulator plate positioned between a cathode assembly and an electrostatic chuck assembly. The chambers may include an acoustic emission probe in contact with the insulator plate of the substrate support.

In some embodiments, the insulator plate may be seated within a ground plate, and the acoustic emission probe may extend through the ground plate to contact the insulator plate. The insulator plate may be or include a polymeric material seated within an annular ceramic support. The chambers may include a plurality of acoustic emission probes in contact with the insulator plate of the substrate support. The acoustic emission probe may be positioned in contact with a radial edge of the insulator plate. The electrostatic chuck assembly may be maintained at atmospheric pressure, and the cathode assembly may be maintained at a pressure maintained below or about 50 Torr, The insulator plate may define a boundary between the atmospheric pressure and the pressure maintained below or about 50 Torr. The acoustic emission probe may be configured to monitor emissions through the insulator plate. The acoustic emission probe may be configured to identify emissions above a threshold greater than or about 35 dB.

Some embodiments of the present technology may encompass semiconductor processing chambers. The chambers may include a chamber body defining a substrate processing region. The chambers may include a substrate support positioned within the substrate processing region.

The substrate support may include an electrostatic chuck configured to support a semiconductor substrate. The substrate support may include a cooling plate coupled with the electrostatic chuck and configured to receive a temperature controlled fluid at a first temperature. The substrate support may include a facility plate operable at a second temperature greater than the first. The substrate support may include a gap formed between the cooling plate and the facility plate within the substrate support. The chambers may include an acoustic emission probe extending through the facility plate and the cooling plate. The acoustic emission probe may be in contact with the electrostatic chuck.

In some embodiments, the facility plate may be coupled with the electrostatic chuck at a radial edge of the electrostatic chuck. The facility plate may maintain the gap along a radial edge of the cooling plate. The temperature controlled fluid may be maintained at a temperature below or about −50° C. A vacuum may be maintained within the gap between the cooling plate and the facility plate. The facility plate may define a recessed ledge on a surface of the facility plate opposite a surface of the facility plate facing the gap. A vacuum seal may extend along the recessed ledge and may form a seal between the acoustic emission probe and the facility plate. The acoustic emission probe may be seated within a recess defined within the electrostatic chuck. The acoustic emission probe may be configured to detect stress effects within a substrate seated on the substrate support.

Some embodiments of the present technology may encompass methods of semiconductor processing. The methods may include performing a process on a semiconductor substrate, where the semiconductor substrate may be seated on a substrate support within a processing region of a semiconductor processing chamber. The methods may include detecting acoustic emissions from an acoustic emission probe positioned against an insulator plate or an electrostatic chuck of the substrate support. The methods may include identifying an acoustic emission above a threshold emission level while performing the process. The methods may include adjusting the process to reduce stress within the insulator plate or the semiconductor substrate. The process may be performed while maintaining the substrate support at a temperature below or about 0° C.

A first acoustic emission probe may be positioned against the insulator plate, and a second acoustic emission probe may be positioned against the electrostatic chuck. The substrate support may be or include a ceramic or polymeric insulator plate positioned between a cathode assembly and an electrostatic chuck assembly. The insulator plate may be seated within a ground plate, and the first acoustic emission probe may extend through the ground plate to contact the insulator plate. The substrate support may include an electrostatic chuck configured to support a semiconductor substrate. The substrate support may include a cooling plate coupled with the electrostatic chuck and configured to receive a temperature controlled fluid at a first temperature. The substrate support may include a facility plate operable at a second temperature greater than the first. The substrate support may define a gap formed between the cooling plate and the facility plate within the substrate support.

Such technology may provide numerous benefits over conventional systems and techniques. For example, the components may identify when damage may be forming on aspects of a substrate or substrate support. Additionally, monitoring may be performed during processing, which may be used to modify chamber conditions to limit damage that may otherwise be caused by the process conditions. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
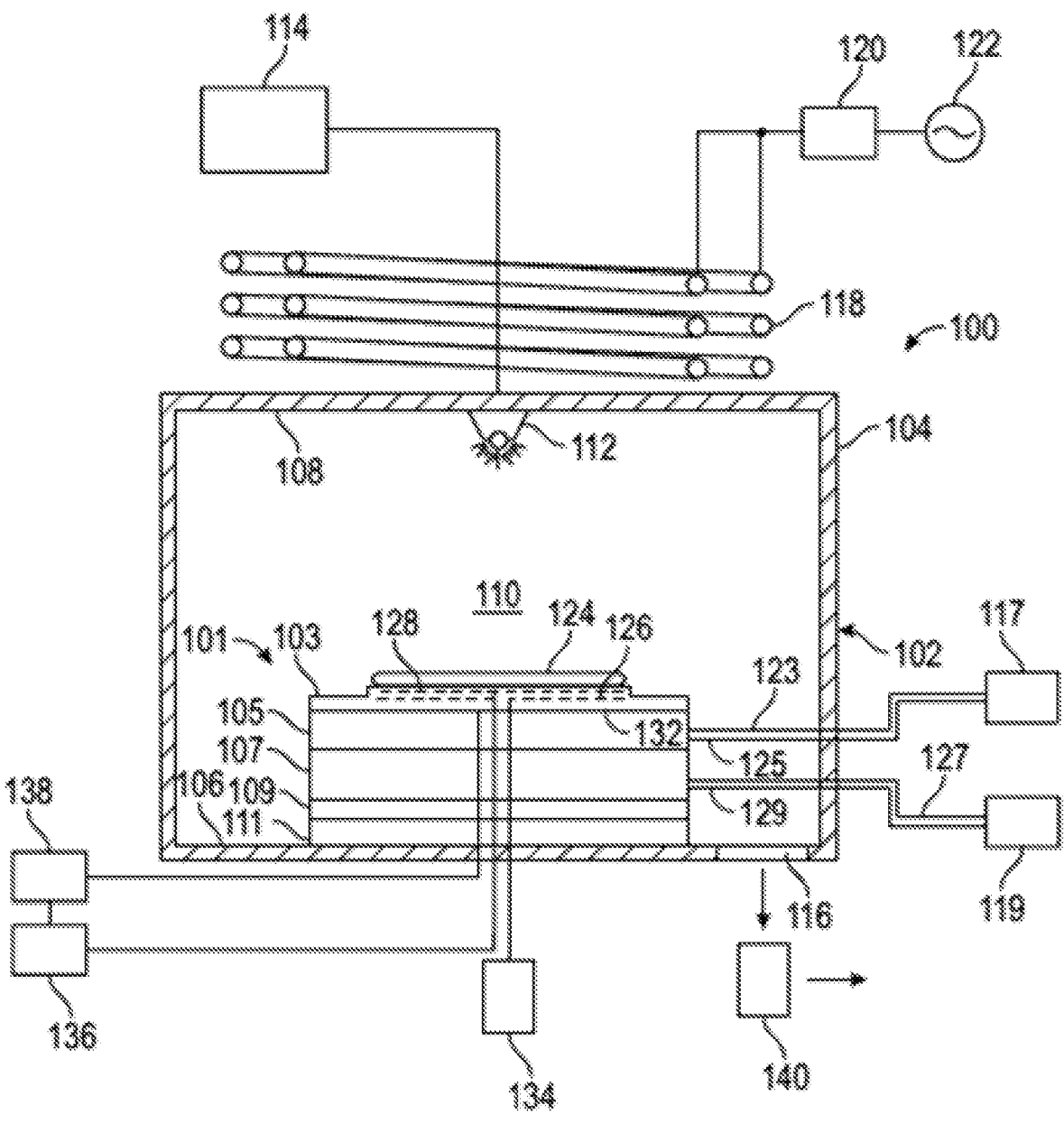
FIG. 1 shows a schematic cross-sectional view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Semiconductor processing includes a number of formation and removal operations performed to produce intricate structures on a substrate. As feature sizes continue to reduce, and processing effects produce greater impact on materials formed or removed, improved control over processing aspects may become more beneficial. For example, as aspect ratios continue to increase for features produced on substrates, improving etch processes may increase control over dimensions and feature profiles. For example, reactive ion etching processes may be performed to produce recessed features within a substrate. By reducing a temperature at which the process may occur, greater control over anisotropic etching may be provided by limiting lateral aspects of ion interaction.

To control temperatures of the substrate for processing, substrate supports may have multiple features to provide increased control and manipulation of temperature. For example, as processing may extend into cryogenic temperature regimes, substrate supports may include a number of features to facilitate the temperatures which may routinely extend below −50° C. or lower. These temperatures may create more fragile substrates, which may be more likely to crack during processing. Similarly, the substrate support may include insulator plates that may thermally and/or electrically isolate some aspects of the substrate support from other aspects. Chemistry, thermal, as well as mechanical stress imparted on insulator materials may cause cracking or other damage. When these insulator plates form a boundary between vacuum and atmospheric conditions, this damage may lead to leakage into the chamber.

The present technology overcomes these issues by incorporating one or more acoustic emission probes with the substrate support. The probes may monitor the substrate support or substrate to detect damage that may be forming. By identifying when damage is likely to occur, processing may be adjusted or controlled to limit damage to the material. Additionally, by collecting data over a variety of conditions, a feed-forward process may be created, which may allow adjustments to process conditions based on specific emissions readings collected by the probe.

Although the remaining disclosure will routinely identify specific etching and cleaning processes utilizing the disclosed technology, it will be readily understood that the systems and methods are equally applicable to a variety of other processes as may occur in the described chambers. Accordingly, the technology should not be considered to be so limited as for use with the described treatment and cleaning processes alone. The disclosure will discuss one possible system and chamber that can be used with the present technology before describing systems and methods or operations of exemplary process sequences according to some embodiments of the present technology. It is to be understood that the technology is not limited to the equipment described, and processes discussed may be performed in any number of processing chambers and systems.

FIG. 1 illustrates a cross-sectional schematic view of an exemplary plasma processing chamber 100, shown configured as an etch chamber, having a substrate support assembly 101. The substrate support assembly 101 may be utilized in other types of plasma processing chambers, for example plasma treatment chambers, annealing chambers, physical vapor deposition chambers, chemical vapor deposition chambers, and ion implantation chambers, among others, as well as other systems that may uniformly maintain a surface or substrate, such as a substrate 124, at a particular temperature. In some embodiments chamber 100 may be configured for cryogenic processing, although any other processing conditions may similarly be encompassed. Reactive ion etching a substrate maintained at a cryogenic temperature may improve anisotropic aspects of the etch process as explained above, for example.

The plasma processing chamber 100 may include a chamber body 102 having sidewalls 104, a base 106, and a lid 108 that may enclose a processing region 110. An injection apparatus 112 may be coupled with the sidewalls 104 and/or lid 108 of the chamber body 102. A gas panel 114 may be fluidly coupled with the injection apparatus 112 to allow process gases to be provided into the processing region 110. The injection apparatus 112 may be one or more nozzle or inlet ports, or alternatively a showerhead. Process gases, along with any processing by-products, may be removed from the processing region 110 through an exhaust port 116 formed in the sidewalls 104 or base 106 of the chamber body 102. The exhaust port 116 may be coupled with a pumping system 140, which may include throttle valves, pumps, or other materials utilized to control the vacuum levels within the processing region 110.

The process gases may be energized to form a plasma within the processing region 110. For example, the process gases may be energized by capacitively or inductively coupling RF power to the process gases. In the embodiment depicted in the figure, a plurality of coils 118 for inductively coupled plasma generation may be disposed above the lid 108 of the plasma processing chamber 100 and may be coupled through a matching circuit 120 to an RF power source 122.

The substrate support assembly 101 may be disposed in the processing region 110 below the injection apparatus 112. The substrate support assembly 101 may include an electrostatic chuck 103 and a base assembly 105. The base assembly may be coupled with the electrostatic chuck 103 and a facility plate 107. The facility plate 107 may be supported by a ground plate 111, and may be configured to facilitate electrical, cooling, heating, and gas connections with the substrate support assembly 101. The ground plate 111 may be supported by the base 106 of the processing chamber, although in some embodiments the assembly may couple with a shaft that may be vertically translatable within the processing region of the chamber. An insulator plate 109 may insulate the facility plate 107 from the ground plate 111, and may provide thermal and/or electrical insulation between the components.

The base assembly 105 may include or define a refrigerant channel coupled with a fluid delivery system 117. In some embodiments, fluid delivery system 117 may be a cryogenic chiller, although the present technology is not limited to cryogenic applications as will be explained further below. The fluid delivery system 117 may be in fluid communication with the refrigerant channel via a refrigerant inlet conduit 123 connected to an inlet of the refrigerant channel and via a refrigerant outlet conduit 125 connected to an outlet of the refrigerant channel such that the base assembly 105 may be maintained at a predetermined temperature, such as a first temperature. In some embodiments, the fluid delivery system 117 may be coupled with an interface box to control a flow rate of the refrigerant. The refrigerant may include a material that can maintain any temperature, including a cryogenic temperature, that may be below or about 0° C., below or about –50° C., below or about –80° C., below or about –100° C., below or about –125° C., below or about –150° C., or lower.

Again, it is to be understood that other substrate supports encompassed by the present technology may be configured to operate at a variety of other processing temperatures as well, including above or about 0° C., greater than or about 100° C., greater than or about 250° C., greater than or about 400° C., or greater. The fluid delivery system 117 may provide the refrigerant, which may be circulated through the refrigerant channel of the base assembly 105. The refrigerant flowing through the refrigerant channel may enable the base assembly 105 to be maintained at the processing temperature, which may assist in controlling the lateral temperature profile of the electrostatic chuck 103 so that a substrate 124 disposed on the electrostatic chuck 103 may be uniformly maintained at a cryogenic processing temperature.

The facility plate 107 may include or define a coolant channel coupled with a chiller 119. The chiller 119 may be in fluid communication with the coolant channel via a coolant inlet conduit 127 connected to an inlet of the coolant channel and via a coolant outlet conduit 129 connected to an outlet of the coolant channel such that the facility plate 107 may be maintained at a second temperature, which in some embodiments may be greater than the first temperature. In some embodiments, a single, common chiller may be used for fluid delivery to both the base assembly and the facility plate. Consequently, in some embodiments fluid delivery system 117 and chiller 119 may be a single chiller or fluid delivery system. In some embodiments, the chiller 119 may be coupled with an interface box to control a flow rate of the coolant. The coolant may include a material that can maintain temperatures greater than or about 0° C., and may maintain temperatures greater than or about 20° C., greater than or about 30° C., greater than or about 40° C., greater than or about 50° C., or greater. In some embodiments, alternative heating mechanisms may be employed including resistive heaters, which may be distributed in the facility plate, the electrostatic chuck, or the base assembly. In some embodiments the facility plate may not include heating components. The chiller 119 may provide the coolant, which may be circulated through the coolant channel of the facility plate 107. The coolant flowing through the coolant channel may enable the facility plate 107 to be maintained at a predetermined temperature, which may assist in maintaining the insulator plate 109 at a temperature above the first temperature, for example.

The electrostatic chuck 103 may include a support surface on which a substrate 124 may be disposed, and may also include a bottom surface 132 opposite the support surface. In some embodiments, the electrostatic chuck 103 may be or include a ceramic material, such as aluminum oxide, aluminum nitride, or other suitable materials. Additionally, the electrostatic chuck 103 may be or include a polymer, such as polyimide, polyetheretherketone, polyaryletherketone, or any other polymer which may operate as an electrostatic chuck within the processing chamber.

The electrostatic chuck 103 may include a chucking electrode 126 incorporated within the chuck body. The chucking electrode 126 may be configured as a monopole or bipolar electrode, or any other suitable arrangement for electrostatically clamping a substrate. The chucking electrode 126 may be coupled through an RF filter to a chucking power source 134, which may provide a DC power to electrostatically secure the substrate 124 to the support surface of the electrostatic chuck 103. The RF filter may prevent RF power utilized to form a plasma within the plasma processing chamber 100 from damaging electrical equipment or presenting an electrical hazard outside the chamber.

The electrostatic chuck 103 may include one or more resistive heaters 128 incorporated within the chuck body. The resistive heaters 128 may be utilized to elevate the temperature of the electrostatic chuck 103 to a processing temperature suitable for processing a substrate 124 disposed on the support surface. The resistive heaters 128 may be coupled through the facility plate 107 to a heater power source 136. The heater power source 136 may provide power, which may be several hundred watts or more, to the resistive heaters 128. The heater power source 136 may include a controller utilized to control the operation of the heater power source 136, which may generally be set to heat the substrate 124 to a predetermined processing temperature. In some embodiments, the resistive heaters 128 may include a plurality of laterally separated heating zones, and the controller may enable at least one zone of the resistive heaters 128 to be preferentially heated relative to the resistive heaters 128 located in one or more of the other zones. For example, the resistive heaters 128 may be arranged concentrically in a plurality of separated heating zones. The resistive heaters 128 may maintain the substrate 124 at a processing temperature suitable for processing.

The substrate support assembly 101 may include one or more probes disposed therein. In some embodiments, one or more low temperature optical probe assemblies may be coupled with a probe controller 138. Temperature probes may be disposed in the electrostatic chuck 103 to determine the temperature of various regions of the electrostatic chuck 103. In some embodiments, each probe may correspond to a zone of the plurality of laterally separated heating zones of the resistive heaters 128. The probes may measure the temperature of each zone of the electrostatic chuck 103. The probe controller 138 may be coupled with the heater power source 136 so that each zone of the resistive heaters 128 may be independently heated. This may allow the lateral temperature profile of the electrostatic chuck 103 to be maintained substantially uniform based on temperature measurements, which may allow a substrate 124 disposed on the electrostatic chuck 103 to be uniformly maintained at the processing temperature.

Figure 2:
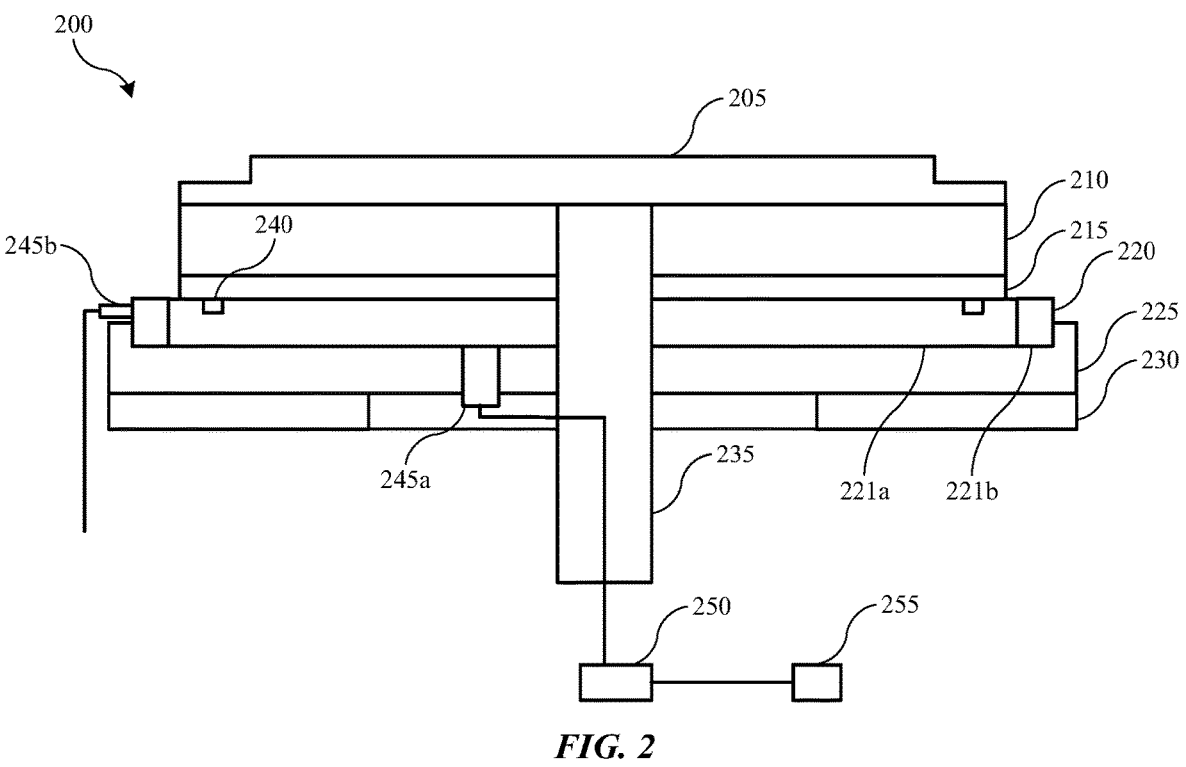
FIG. 2 shows a schematic partial cross-sectional view of an exemplary substrate support according to some embodiments of the present technology.

One or more different aspects of the substrate support assembly 101 may be monitored in embodiments of the present technology, by incorporating an acoustic emission probe that may monitor signals distributed through one or more aspects of the substrate support. FIG. 2 shows a schematic partial cross-sectional view of an exemplary substrate support 200 according to some embodiments of the present technology. For example, substrate support 200 may illustrate a portion of substrate support assembly 101 described above, and may include any aspect of that support assembly, and may illustrate additional details of that support assembly. Substrate support 200 may illustrate a simplified cross-section of a support structure, which may include a number of other components or aspects as previously described, or as may be included in substrate supports. It is to be understood that substrate support 200 is not illustrated to any particular scale, and is included merely to illustrate aspects of the present technology. Substrate support 200 may be included within a chamber as previously described, as well as any other processing chamber, which may define a substrate processing region, such as with one or more walls of a chamber body, or other components positioned within the processing chamber.

Substrate support 200 may include a number of components bonded, welded, joined, or otherwise coupled with one another. Although a number of additional components may be included, as illustrated, the substrate support 200 may include an electrostatic chuck 205, which may be coupled with a power source to provide electrostatic chucking or clamping of a substrate that may be seated on a surface of the puck. Although any surface topography may be encompassed by the present technology, in some embodiments chuck 205 may define a number of protrusions or mesas on which a substrate may be seated, although a flat surface or pocket may also be formed within the electrostatic chuck 205. Electrostatic chuck 205 may be coupled with a bonded assembly 210, which may include one or more channels for fluid delivery. The bonded assembly may be seated on a facility plate 215 as previously described. Any of these components alone or together may constitute an electrostatic chuck assembly.

The facility plate may be seated on an insulator plate 220, which may be a thermally and/or electrically insulating material. For example, in some embodiments the electrostatic chuck 205 may be operating at a DC potential, and may be operated at a different potential than the cathode because of substrate chucking. Insulator plate 220 may maintain the sections of the electrostatic chuck assembly and a cathode assembly isolated from one another. The insulator plate 220 may be or include a ceramic material or a polymeric material in some embodiments. Any number of ceramics, such as nitrides or oxides, may be used, as well as a range of polymeric materials, including polystyrene or other materials, including cross-linked materials. In some embodiments the insulator plate may be a combination of materials, and may include a first portion 221a seated within an annular second portion 221b. For example, first portion 221a may be or include a polymeric material, while second portion 221b may be a ceramic. It is to be understood that any other materials may similarly be utilized, and various other combinations are similarly encompassed.

The insulator plate 220 may be seated in a ground plate 225, which may be coupled with one or more of a cathode 230 component and other base aspects or components, which may be or may operate together as a cathode assembly. As previously explained, insulator plate 220 may provide electrical and/or thermal insulation functions, and may also operate as a barrier for pressure in some embodiments. For example, shaft 235, which may provide access to or through one or more aspects of the substrate support may extend outside of the processing chamber, for probe and other electrode connections, and may be at atmospheric pressure or higher. This region may extend through one or more components of the cathode assembly. Additionally, the electrostatic chuck assembly may operate at vacuum conditions at which processing is being performed, which may be less than or about 100 Torr, and may be less than or about 50 Torr, less than or about 20 Torr, less than or about 10 Torr, less than or about 1 Torr, less than or about 100 mTorr, less than or about 50 mTorr, less than or about 5 mTorr, or less. The insulator plate may divide the cathode assembly, features of which may be at atmospheric pressure, from the electrostatic chuck assembly, features of which may be at vacuum pressures.

As previously explained, during processing, the insulator plate may be affected by thermal stresses as processing operations cycle temperatures within the substrate support. Over time, the insulator plate may crack, such as at outward surfaces, including at bolt holes or connection points 240. These locations may be adjacent sealing with facility plate 215, which may be at vacuum pressure. When cracks or fissures extend in this region, leakage may occur between the atmospheric aspects of the substrate support and the vacuum processing region. When this occurs, maintaining vacuum conditions within the chamber may be challenged, and plasma conditions may be affected by the drifting pressure. These defects in the insulator plate may not be readily apparent as process drifting occurs, and may cause uniformity issues for processing until the part further degrades and damage is noticed, or the issue becomes more pronounced in processing outcomes, which may increase tool downtime as well.

The present technology may include aspects to improve recognition of stress events on the insulator plate by incorporating an acoustic emission probe 245, which may be positioned in contact with the insulator plate 220 of the substrate support, or may be incorporated to contact any other component within the substrate support, including as will be described further below. In some embodiments, one or more acoustic emission probes may be incorporated to monitor emissions within the structure. For example, as thermal stresses impact the insulator material, cracking or other deformation may emit acoustic waves through the component. Acoustic emission probe 245 may detect the waves, and may provide indications that the component may be failing. Not all thermal stress acoustic emissions may necessarily indicate damage, and may at times identify the expansion and compression of the material, which may be within acceptable tolerances. Accordingly, in some embodiments, the acoustic emission probe 245 may be operated to monitor emissions to detect emissions that surpass a threshold, which may be predetermined to indicate damage to the component.

For example, acoustic emission probe 245 may be coupled with an amplifier 250, which may provide the signal to a processor 255, which may include a filter, to map and monitor signals from the probe. In some embodiments the processor may be a system controller or may be coupled with a system controller that may operate to perform processing operations within the chamber. As signals surpass a threshold, one or more adjustments may be made to the process conditions, or may log the event to determine whether the condition is transient or begins a trend attributable to damage to the component. In some embodiments multiple acoustic emission probes may be positioned in contact with the insulator plate, and may be electrically coupled with a single transducer or receiver, which may provide increased accuracy for identifying a location for the emission as well as effects of the event. The probes may be seated at any location, and may be at various radial locations to monitor across the component.

As illustrated, acoustic emission probe 245a may be positioned on a backside of the insulator plate, such as through the substrate support, which may protect the probe from the chamber environment, and limit the amount of sealing against vacuum conditions applied. For example, the probe may extend through an aperture defined in the ground plate 225 to provide access to contact the insulator plate 220. Additionally, an acoustic emission probe may be positioned in contact with a radial edge of the insulator plate, such as with acoustic emission probe 245b. Probe 245b may include additional housing or sealing as the probe may extend through the plasma processing region to access the radial edge as illustrated. Additionally, the probe may be positioned between a liner on the exterior of the components, which may limit exposure to the processing environment. Any combination of probes may be used, and the figure is included merely to illustrate some examples encompassed by the present technology.

Figure 3:
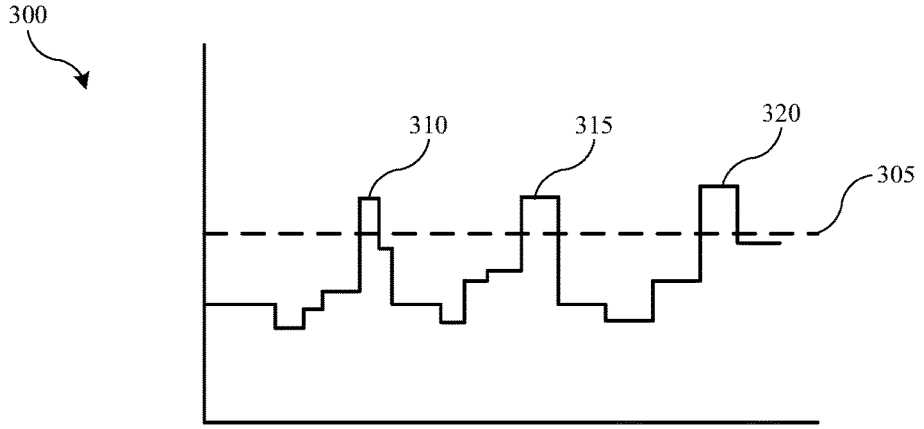
FIG. 3 shows a chart of acoustic emissions monitoring during substrate processing according to some embodiments of the present technology.

Turning to FIG. 3 is shown a chart 300 of exemplary acoustic emissions monitoring during substrate processing according to some embodiments of the present technology. The chart may illustrate acoustic emission amplitude over time. An amount of noise may occur during processing, which may not be indicative of events such as damage or cracking of the plate. For example, acoustic sensors according to the present technology may be relatively sensitive, which may detect minor thermal expansions and contractions of the component, as well as effects from the plasma process itself. Consequently, in some embodiments the acoustic probe or system may be configured to monitor for emissions that surpass a threshold, illustrated as line 305. The threshold may be based on any level of sensitivity, and in some embodiments may monitor for events that create emissions above a threshold of greater than or about 10 dB, and may monitor for events greater than or about 20 dB, greater than or about 30 dB, greater than or about 40 dB, greater than or about 50 dB, greater than or about 60 dB, greater than or about 70 dB, greater than or about 80 dB, greater than or about 90 dB, greater than or about 100 dB, greater than or about 110 dB, greater than or about 120 dB, or greater, as well as any smaller range included within any of these stated ranges, such as greater than or about 15 dB, for example.

As illustrated, a first event 310 surpassing the threshold or line 305 may be detected by the probe or controller. Based on the type of event, extent to which it surpasses the threshold, or other criteria, the event may trigger a change in processing, or may simply be noted by the system, to watch for subsequent events. A second event 315 may be greater than the first, and may begin an associated trend where damage may be forming within the component. Additionally, any number of processing changes, such as pressure, temperature, or plasma conditions, may be adjusted to reduce the effects of the event, or attempt to prevent subsequent events. A third event 320 may be even greater, and may increase noise based on an extending fissure forming in the component. Once a sufficient trend has occurred, or a significant enough event, processing may be halted to fix or exchange the component. By monitoring the events occurring, component damage may be detected prior to sufficient effects on substrate processing, which may limit substrate scrapping or damage. Additionally, as monitoring and testing occurs over time, a library may be developed of what types of acoustic emissions may be indicative of what types of chamber effects. Consequently, finer tuning of processing conditions or operations may be performed to improve component life times.

Figure 4A:
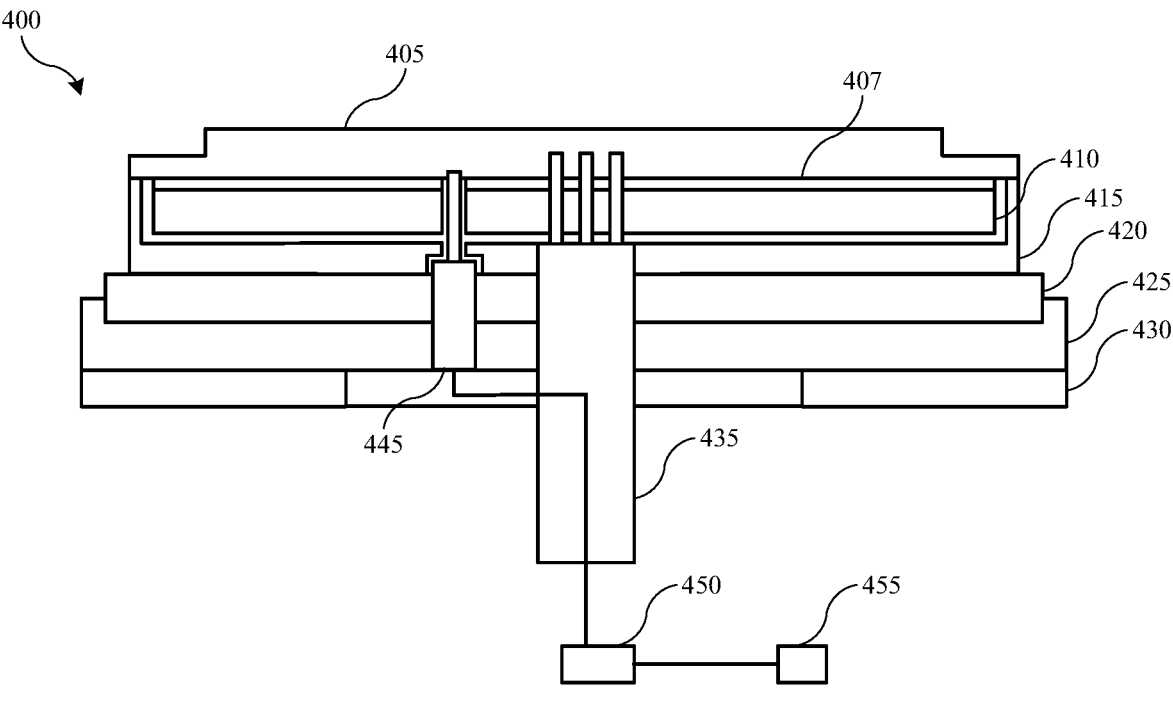
FIG. 4A shows a schematic partial cross-sectional view of an exemplary substrate support according to some embodiments of the present technology.

FIG. 4A shows a schematic partial cross-sectional view of an exemplary substrate support 400 according to some embodiments of the present technology. For example, substrate support 400 may illustrate a portion of substrate support assembly 101 described above, and may include any aspect of that support assembly, and may illustrate additional details of that support assembly. Additionally, substrate support 400 may include any aspect of substrate support 200 described above, such as the acoustic emission probe 245 or any other component of the system. Similarly, substrate support 200 may further include any aspect of substrate support 400 described below. Substrate support 400 may illustrate a simplified cross-section of a support structure, which may include a number of other components or aspects as previously described, or as may be included in substrate supports. It is to be understood that substrate support 400 is not illustrated to any particular scale, and is included merely to illustrate aspects of the present technology. Substrate support 400 may be included within a chamber as previously described, as well as any other processing chamber, which may define a substrate processing region, such as with one or more walls of a chamber body, or other components positioned within the processing chamber.

Substrate support 400 may include a number of components bonded, welded, joined, or otherwise coupled with one another. In some embodiments, substrate support 400 may be operated as a cryogenic substrate support, which may be adapted to provide substrate support or substrate temperatures below or about −50° C., below or about −100° C., below or about −150° C., or lower. Although a number of additional components may be included, as illustrated, the substrate support 400 may include an electrostatic chuck 405, which may be coupled with a power source to provide electrostatic chucking or clamping of a substrate that may be seated on a surface of the puck. Although any surface topography may be encompassed by the present technology, in some embodiments chuck 405 may define a number of protrusions or mesas on which a substrate may be seated, although a flat surface or pocket may also be formed within the electrostatic chuck 405.

Electrostatic chuck 405 may be coupled with a base plate 407, which may be incorporated to facilitate cryogenic operation. Substrate support 400 may also include a cooling plate 410, which may be configured to receive a temperature controlled fluid as previously described. These components may form an electrostatic chuck assembly. To facilitate thermal transfer from the cooling plate to the chuck, components may be selected to match characteristics of the materials, which may affect large temperature adjustments or operation. For example, electrostatic chuck 405 may be or include a ceramic material, while cooling plate 410 may be or include a metal. To accommodate differences of coefficients of thermal expansion between the materials, base plate 407 may be selected to coordinate with the electrostatic chuck. For example, in some embodiments base plate 410 may be molybdenum or other materials which may appropriately match a coefficient of thermal expansion of the electrostatic chuck 405 material.

Substrate support 400 may include a facility plate 415, which may extend about components of the electrostatic chuck assembly. In some embodiments, as previously described, the facility plate may be operated at a second temperature greater than the first, which may facilitate maintaining the cathode assembly at higher temperatures. An insulator plate 420 may be seated under the facility plate, and may include any aspect of insulator plates discussed above. A ground plate 425 may be included, and in which insulator plate 420 may be seated. One or more additional cathode components 430 may be coupled with the substrate support as well. A shaft 435 may extend through some or all of the stack components, and may provide a channel for electrodes, probes, or other components to access the electrostatic chuck 405.

In some embodiments, an acoustic emission probe 445 may extend through one or more of the components, and may be seated in contact with the electrostatic chuck 405. Although only one acoustic emission probe 445 is illustrated, it is to be understood that any number of probes may be included in contact with any region of the substrate support to facilitate detection and accuracy. For example, one or more additional probes may be positioned radially outward of the probe illustrated. As discussed above, cryogenic applications may occur at temperatures at which a substrate may become more fragile. During plasma processing, cracks may develop on or through the substrate, which may lead to failure and impact device yield. Acoustic emission probe 445 may be in contact with the electrostatic chuck to which a substrate may be clamped, and the probe may monitor and detect acoustic emissions from the substrate. Similar to as explained above for substrate support 200, the probe may be coupled with an amplifier 450, and a processor 455, as well as any number of additional receiving and filtering components. The probe may detect events above a threshold, which may indicate damage to a wafer, and may be used with a controller to modify conditions within the chamber as previously described. In this way, adjustments may be made to the process being performed, or future processes, which may reduce stresses or impact on the substrate, and improve device yield.

Figure 4B:
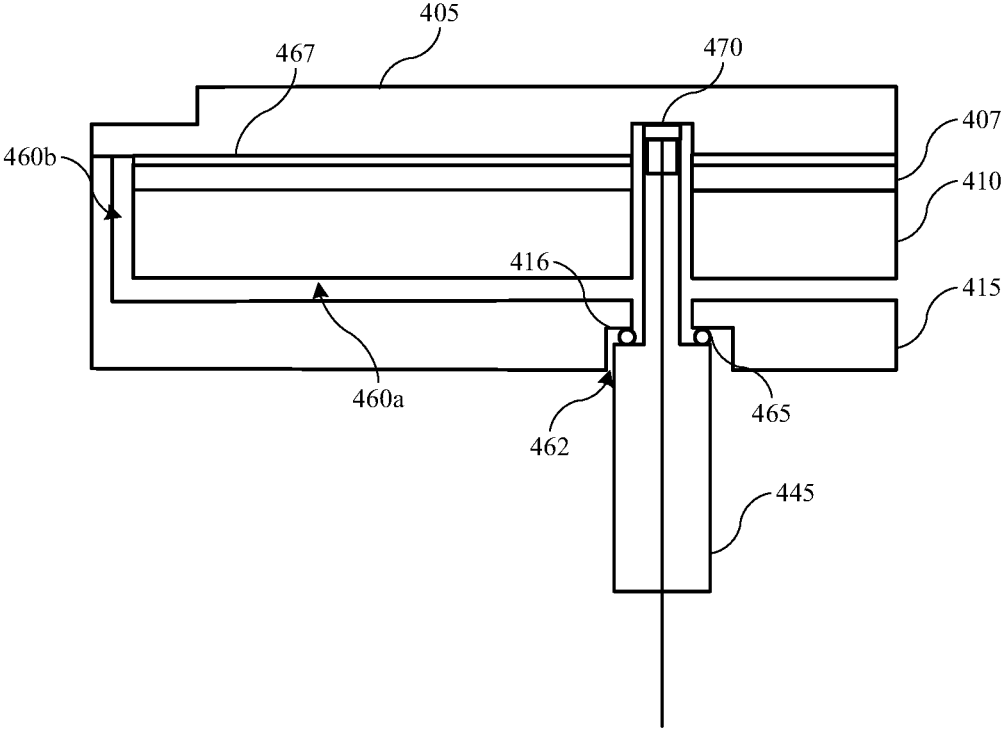
FIG. 4B shows a schematic partial cross-sectional view of an exemplary substrate support according to some embodiments of the present technology.

FIG. 4B shows a schematic partial cross-sectional view of exemplary substrate support 400 according to some embodiments of the present technology, and may show a detailed view of acoustic emission probe 445 described above. For example, the figure may illustrate a portion of electrostatic chuck 405, base plate 407, cooling plate 410, and facility plate 415. As illustrated, facility plate 415 may be coupled with the electrostatic chuck 405 at a radial edge of the electrostatic chuck, and may form a gap 460, which may isolate the cooling components. For example, a gap 460a may be formed between the cooling plate 410 and the facility plate 415, which may produce a thermal barrier between the components. As cooling plate 410 may be receiving a chilled fluid, and facility plate 415 may be receiving a warmed fluid, gap 460 may maintain a barrier facilitating temperature control of each component. As illustrated, by coupling facility plate 415 at a distal or radial edge of electrostatic chuck 405, gap 460b may extend along the radial edges of the cooling plate and base plate. This may allow the cooling components to be in direct contact, or conductive thermal communication only with the electrostatic chuck 405. Additionally, by sealing the gap 460 region between the components, a vacuum may be enabled within gap 460, which may further improve the barrier function of the gap.

The illustration may also include a view of additional bonding material 467 that may be disposed between base plate 407 and electrostatic chuck 405 to improve thermal communication between the components. In some embodiments, any number of bonding materials may be used including polymeric or epoxy materials, as well as metal bonding materials. For example, indium may be included to bond the base plate with the electrostatic chuck. However, during formation, a portion may be masked before application of the coating to ensure access for acoustic emission probe 445 to extend to form a direct contact with electrostatic chuck 405.

Acoustic emission probe 445 may extend through facility plate 415 as well as through the other cooling components prior to contacting electrostatic chuck 405. However, probe 445 may extend from a region at atmospheric conditions as previously explained. Because gap 460 may be maintained at vacuum conditions, aspects of the probe may be sealed between the two environments. For example, facility plate 415 may define a recessed ledge 416 within a bottom surface of the facility plate, or a surface facing insulator plate 420, for example. Acoustic emission probe 445 may extend within the recess, and may include a housing portion that may be seated against the recessed ledge, such as within an atmospheric gap 462. A sealing element 465, such as an elastomeric element may be positioned between the probe housing and the facility plate to form a vacuum seal to limit or prevent leakage between gap 460, which may be at vacuum, and gap 462, which may be at atmospheric conditions.

Within the recessed ledge 416 may be defined an aperture through which a portion of probe 445 may extend to contact electrostatic chuck 405. As illustrated, electrostatic chuck 405 may define a recess in which probe 445 may be seated. Because acoustic emission probe 445 may be internally maintained at atmospheric conditions, an additional seal 470 may be maintained at the tip of the sensor to ensure a seal with vacuum conditions, as well as to provide tolerance to ensure contact with the electrostatic chuck. When performing low temperature processes, leakage from atmosphere may allow moisture to permeate the materials, which may damage any number of the components. Accordingly, in some embodiments, acoustic emission probe 445 may be sealed both where it penetrates the facility plate, as well as at a distal end where it contacts the electrostatic chuck.

In some embodiments, such as at ground plate 425, or somewhere in the cathode assembly, the acoustic emission probe may be connected to the substrate support. Because the aperture through the component may be blind in some embodiments, spring clips or other mechanisms to compressibly couple the probe with the chamber may be employed to ensure contact with the electrostatic chuck and vacuum seal. As illustrated, the apertures through each component may be sized to limit contact between the probe and the components, which may limit temperature effects from the different components. For example, in some embodiments the probe may contact only the electrostatic chuck, and/or the facility plate, such as at the elastomeric seal. By including an acoustic emission probe at the electrostatic chuck, a substrate may be monitored to detect stress effects, which may otherwise cause damage to the substrate.

Figure 5:
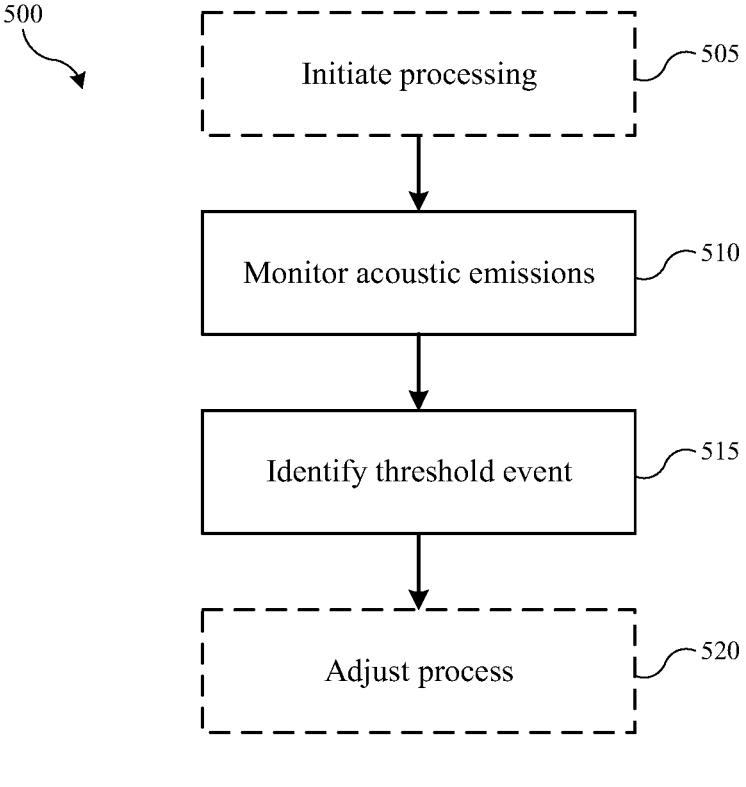
FIG. 5 shows selected operations in a method of processing a semiconductor substrate according to some embodiments of the present technology.

FIG. 5 illustrates a method 500 of processing a semiconductor substrate, operations of which may be performed, for example, in one or more chambers 100. Any other chamber may also be utilized, which may perform one or more operations of any method or process described. Additionally, the method may be performed with chambers or systems including substrate supports that may be or include any aspect of substrate support 200 and/or substrate support 400 described previously. Method 500 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below.

Method 500 may involve optional operations to develop a semiconductor substrate to a particular fabrication operation. Although in some embodiments method 500 may be performed on a base structure, in some embodiments the method may be performed subsequent other material formation. For example, any number of deposition, masking, or removal operations may be performed at optional operation 505 to produce any transistor, memory, or other structural aspects on a substrate. The substrate may be disposed on a substrate support, which may be positioned within a processing region of a semiconductor processing chamber. The operations may be performed in the same chamber in which aspects of method 500 may be performed, and one or more operations may also be performed in one or more chambers on a similar platform as a chamber in which operations of method 500 may be performed, or on other platforms.

During the processing operations, or during some operation for which a substrate is included within the processing chamber, an acoustic emission probe or set of probes as previously described may be used to monitor or detect acoustic emissions at operation 510. For example, an acoustic emission probe may be positioned against an insulator plate, an electrostatic chuck, or any other component or combination of components of the substrate support. The substrate support may be or include any material, component, or characteristic of any component or configuration previously described, including any aspect of substrate support 200 and/or substrate support 400. The emission probe may be coupled with a system as previously described, which may filter or otherwise adjust the detected emissions for events.

At operation 515, while the process is occurring within the chamber, an acoustic emission may be identified as exceeding a threshold level, which may indicate damage to a component of the substrate support of a substrate being processed. At optional operation 520, and based at least in part on one or more identified events, an adjustment may be made to the process, or process conditions, which may reduce stress within the insulator plate, substrate support, or any other component being monitored. The process may be any process described previously, which may include processes occurring at substrate temperatures below 0° C., including other cryogenic temperatures. By incorporating one or more acoustic emission probes as described, improved process monitoring and diagnostic review of processing may be afforded. This may lead to faster response times to component or material damage, and may facilitate improved processing to reduce or limit thermal stress effects on substrates or components within the system.

For example, processing of the sensor data, and subsequent results may be used to generate or initiate a library of results or outcomes that may facilitate future processes. This generated library may be accessed by a processor for machine learning, where an algorithm may be implemented to identify patterns from processing scenarios, which may provide a machine learning model to facilitate predictive adjustments to processing or chamber conditions. Algorithms may include consideration of chamber conditions, process conditions, materials or properties for components of the system, among any number of other considerations that may be collected during processing and analyzed to train the machine learning model. Deep machine learning algorithms may be developed for substrate or substrate support failure detection and monitoring. The machine learning may further populate the data library and iteratively improve predictions for any number of chamber or processing scenarios. Consequently, over time the model may control processing by predicting effects based on received acoustic emissions, and may adjust any number of processing parameters in situ to protect substrate or chamber components, and improve process outcomes.

One or more computing devices or components may be adapted to provide some of the desired functionality described herein by accessing software instructions rendered in a computer-readable form. The computing devices may process or access signals for operation of one or more of the components of the present technology, such as the acoustic emission processor or controller, for example. When software is used, any suitable programming, scripting, or other type of language or combinations of languages may be used to perform the processes described. However, software need not be used exclusively, or at all. For example, some embodiments of the present technology described above may also be implemented by hard-wired logic or other circuitry, including but not limited to application-specific circuits. Combinations of computer-executed software and hard-wired logic or other circuitry may be suitable as well.

Some embodiments of the present technology may be executed by one or more suitable computing device adapted to perform one or more operations discussed previously. As noted above, such devices may access one or more computer-readable media that embody computer-readable instructions which, when executed by at least one processor that may be incorporated in the devices, cause the at least one processor to implement one or more aspects of the present technology. Additionally or alternatively, the computing devices may comprise circuitry that renders the devices operative to implement one or more of the methods or operations described.

Any suitable computer-readable medium or media may be used to implement or practice one or more aspects of the present technology, including but not limited to, diskettes, drives, and other magnetic-based storage media, optical storage media, including disks such as CD-ROMS, DVD-ROMS, or variants thereof, flash, RAM, ROM, and other memory devices, and the like.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the probe" includes reference to one or more probes and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing chamber comprising:
a chamber body defining a substrate processing region;
a substrate support positioned within the substrate processing region, wherein the substrate support comprises
a ceramic or polymeric insulator plate positioned between a cathode assembly and an electrostatic chuck assembly, and
a facility plate seated on the insulator plate; and
an acoustic emission probe in contact with the insulator plate of the substrate support.

2. The semiconductor processing chamber of claim 1, wherein the insulator plate is seated within a ground plate, and wherein the acoustic emission probe extends through the ground plate to contact the insulator plate.

3. The semiconductor processing chamber of claim 1, wherein the insulator plate comprises a polymeric material seated within an annular ceramic support.

4. The semiconductor processing chamber of claim 1, further comprising a plurality of acoustic emission probes in contact with the insulator plate of the substrate support.

5. The semiconductor processing chamber of claim 1, wherein the acoustic emission probe is positioned in contact with a radial edge of the insulator plate.

6. The semiconductor processing chamber of claim 1, wherein the insulator plate defines a barrier between the cathode assembly and the electrostatic chuck assembly, wherein the cathode assembly is maintained at atmospheric pressure, and wherein the electrostatic chuck assembly is maintained at a pressure maintained below or about 50 Torr.

7. The semiconductor processing chamber of claim 1, wherein the acoustic emission probe is configured to monitor emissions through the insulator plate, and wherein the acoustic emission probe is configured to identify emissions above a threshold greater than or about 35 dB.

8. A semiconductor processing chamber comprising:
a chamber body defining a substrate processing region;
a substrate support positioned within the substrate processing region, wherein the substrate support comprises:
an electrostatic chuck configured to support a semiconductor substrate,
a cooling plate coupled with the electrostatic chuck and configured to receive a temperature controlled fluid at a first temperature,
a facility plate operable at a second temperature greater than the first temperature, and
a gap formed between the cooling plate and the facility plate within the substrate support; and
an acoustic emission probe extending through the facility plate and the cooling plate, wherein the acoustic emission probe is in contact with the electrostatic chuck;
wherein the electrostatic chuck is seated on the facility plate at a radial edge of the electrostatic chuck.

9. The semiconductor processing chamber of claim 8, wherein the facility plate maintains the gap along a radial edge of the cooling plate.

10. The semiconductor processing chamber of claim 8, wherein the temperature controlled fluid is maintained at a temperature below or about −50° C.

11. The semiconductor processing chamber of claim 8, wherein a vacuum is maintained within the gap between the cooling plate and the facility plate.

12. The semiconductor processing chamber of claim 11, wherein the facility plate defines a recessed ledge on a surface of the facility plate opposite a surface of the facility plate facing the gap.

13. The semiconductor processing chamber of claim 12, wherein a vacuum seal extends along the recessed ledge and forms a seal between the acoustic emission probe and the facility plate.

14. The semiconductor processing chamber of claim 8, wherein the acoustic emission probe is seated within a recess defined within the electrostatic chuck.

15. The semiconductor processing chamber of claim 8, wherein the acoustic emission probe is configured to detect stress effects within a substrate seated on the substrate support.

16. A method of semiconductor processing, the method comprising:
performing a process on a semiconductor substrate in the semiconductor processing chamber according to claim 1, the semiconductor substrate seated on the substrate support;
detecting acoustic emissions;
identifying an acoustic emission above a threshold emission level while performing the process; and
adjusting the process or process conditions to reduce stress detected by the acoustic emission.

17. The method of semiconductor processing of claim 16, wherein the process is performed while maintaining the substrate support at a temperature below or about 0° C.

18. The method of semiconductor processing of claim 16, wherein a second acoustic emission probe is positioned against the electrostatic chuck assembly.

19. The method of semiconductor processing of claim 18, further comprising detecting acoustic emissions from the second acoustic emission probe positioned against the electrostatic chuck assembly.

20. The method of semiconductor processing of claim 16, wherein the process comprises a deposition, a masking, or a removal operation.

* * * * *